(12) United States Patent
Zannoth et al.

(10) Patent No.: US 7,456,693 B2
(45) Date of Patent: Nov. 25, 2008

(54) REGULATION OF AN AMPLIFICATION APPARATUS

(75) Inventors: Markus Zannoth, Munich (DE); Winfried Bakalski, Munich (DE)

(73) Assignee: Infineon Technologies AG, Neubiberg (DE)

(*) Notice: Subject to any disclaimer, the term of this patent is extended or adjusted under 35 U.S.C. 154(b) by 118 days.

(21) Appl. No.: 11/479,075

(22) Filed: Jun. 30, 2006

(65) Prior Publication Data

US 2008/0001674 A1   Jan. 3, 2008

(51) Int. Cl.
H03F 3/04   (2006.01)

(52) U.S. Cl. .................................. 330/296; 330/285

(58) Field of Classification Search ............... 330/296, 330/285, 297, 98, 150, 310
See application file for complete search history.

(56) References Cited

U.S. PATENT DOCUMENTS

| | | | |
|---|---|---|---|
| 3,619,798 A | 11/1971 | Smith et al. | |
| 5,670,911 A | 9/1997 | Hori et al. | |
| 5,894,236 A | 4/1999 | Mizoguchi et al. | |
| 6,008,698 A | 12/1999 | Dacus et al. | |
| 6,031,417 A | 2/2000 | Bechman | |
| 6,081,161 A * | 6/2000 | Dacus et al. | 330/297 |
| 6,323,731 B1 | 11/2001 | McCune, Jr. | |
| 6,617,928 B2 * | 9/2003 | Finlay et al. | 330/288 |
| 6,701,138 B2 | 3/2004 | Epperson et al. | |
| 7,193,459 B1 * | 3/2007 | Epperson et al. | 330/130 |
| 2004/0169530 A1 | 9/2004 | Manganaro | |
| 2005/0057308 A1 | 3/2005 | Veinblat | |
| 2005/0174177 A1 | 8/2005 | Moriwaki et al. | |
| 2006/0009174 A1 | 1/2006 | Dunn | |

FOREIGN PATENT DOCUMENTS

| | | |
|---|---|---|
| EP | 0401013 A2 | 5/1990 |
| EP | 0539070 A1 | 10/1992 |
| EP | 1146636 A1 | 3/2001 |
| EP | 1499016 | 7/2003 |
| GB | 2280325 A | 1/1995 |
| JP | 03228409 A | 9/1991 |
| WO | WO9849771 A1 | 11/1998 |
| WO | 2005/043748 A1 | 5/2005 |

OTHER PUBLICATIONS

European Search Report; date of completion - Feb. 12, 2008; pp. 1-3; Munich, Germany.

* cited by examiner

*Primary Examiner*—Henry K Choe
(74) *Attorney, Agent, or Firm*—Infineon Technologies Patent Department

(57) ABSTRACT

An amplification apparatus includes an amplifier. The amplification apparatus includes a bias voltage circuitry coupled to the amplifier to provide a bias voltage thereto. The amplification apparatus includes a supply voltage circuitry coupled to the amplifier to provide a supply voltage thereto. The supply voltage circuitry is coupled to the bias voltage circuitry. The bias voltage circuitry is configured to provide the bias voltage depending on the supply voltage.

18 Claims, 3 Drawing Sheets

REGULATION OF AN AMPLIFICATION APPARATUS

BACKGROUND

Embodiments of the present invention relate to amplification apparatus, and more particular to a transmitter having an amplification apparatus, and a method for regulation of the amplification apparatus.

In any electronic communication system a transmitter includes an output amplifier, i.e. an amplification apparatus, that boosts the power of a transmission signal to a level sufficient to allow for a reception of the transmission signal by a receiver. Particularly in a wireless communication system, such as defined by the GSM (Global System for Mobile Communication) standard or defined by UMTS (Universal Mobile Telecommunication Standard), the power level of a mobile unit has to be adjusted according to rules given by a base station.

In addition the output amplifier may be subject to strict constraints on linearity and efficiency. If the transmitter is using an amplitude modulation such as 8-PSK modulation used in GSM EDGE (Enhanced Data GSM Environment), the output amplifier has to be arranged so that the output signal is linear in relation to the input signal to avoid a distortion of the output signal.

The efficiency of the output amplifier is defined by the ratio of an outgoing power level at an output of the output amplifier to the power input into the output amplifier. The lower that ratio the more efficient the input power is brought onto the outgoing signal. This is advantageous if the transmitter is part of a mobile terminal having only limited power resources.

BRIEF DESCRIPTION OF THE DRAWINGS

Embodiments of the invention will be explained in detail in the following text with reference to the accompanying drawings, in which.

DETAILED DESCRIPTION

Figure 1:
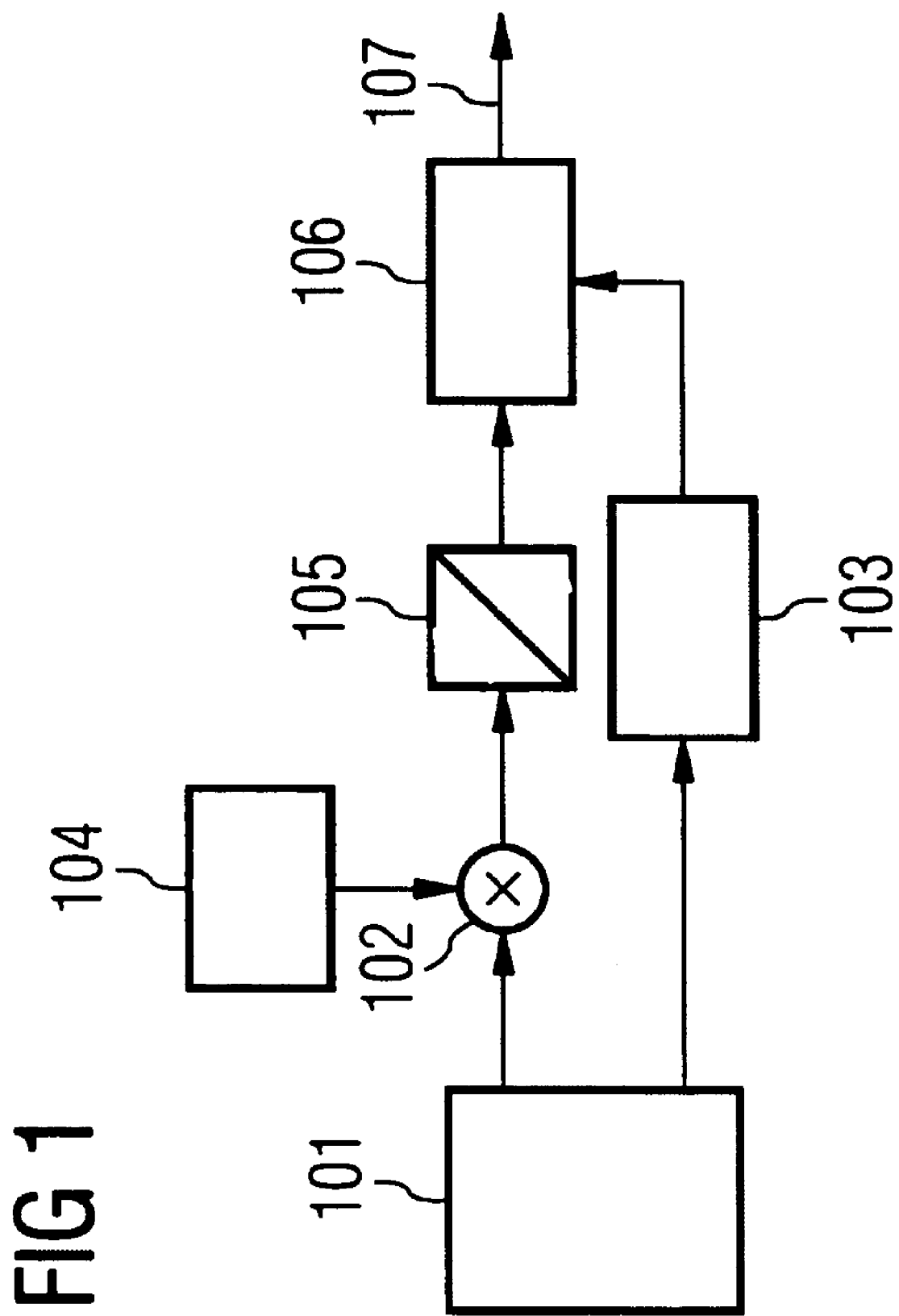
FIG. 1 illustrates a transmitter embodiment of an amplification apparatus.

FIG. 1 is illustrates a transmitter embodiment of an amplification apparatus according to the present invention. It is understood that such amplification apparatus may be used in any application or circuitry to perform signal amplification.

The transmitter illustrated in FIG. 1 includes a transformer 101 that produces a first amplitude information signal and a phase information signal. The transformer 101 produces these signals according to input signals that in various embodiments might be delivered as Cartesian information such as quadrature modulated information or in-phase and quadrature signals. In various embodiments, the ingoing signals may be provided by a baseband unit that includes a microcontroller, a DSP or by any other suitable processing element. The input signals are containing information i.e. data to be transmitted by the transmitter via a transmission channel such as a wireless or wireline channel.

In the illustrated transmitter, the first amplitude information signal is fed into a first input of a mixer 102. The phase information signal is fed into a phase modulator 103. The phase modulator 103 modulates the phase information signal on a carrier frequency which is defined by the transmission channel.

The illustrated transmitter includes a ramping control unit 104 that provides a power control signal that represents the ramping up or ramping down procedure for the transmitter. The ramping control unit 104 is connected to a second input of the mixer 102. The mixer 102 mixes the first amplitude information signal and the power control signal to produce a second amplitude information signal. The mixing is performed by a digital multiplication of the first amplitude information signal and the power control signal. The second amplitude information signal is provided at an output of said mixer 102. This signal includes the amplitude information of the signal to be transmitted and information about the ramping up and/or ramping down of the power level of the transmitter.

The output of mixer 102 is connected to a digital-to-analog converter 105. The digital-to-analog converter 105 converts the second amplitude information signal from a digital form into an analog form of the second amplitude information signal.

An output of the digital-to-analog converter 105 is connected to a modulator 106. An output of the phase modulator 103 is also connected to the modulator 106. The modulator 106 modulates the amplitude information signal in its analog form on the phase information signal being shifted on the carrier frequency of the transmission system. A signal output 107 of the modulator 106 provides an output signal that includes amplitude information, ramping information and/or phase information. In the illustrated transmitter the modulator 106 is an amplification apparatus according to an embodiment of the present invention.

The transmitter illustrated in FIG. 1 includes digital signal processing in the transmission path. The ramping information is brought on the signal or combined with the signal to be transmitted in the digital domain of the transmitter. This is performed by means of the mixer 102. Yet other suitable approaches may be used.

Figure 2:
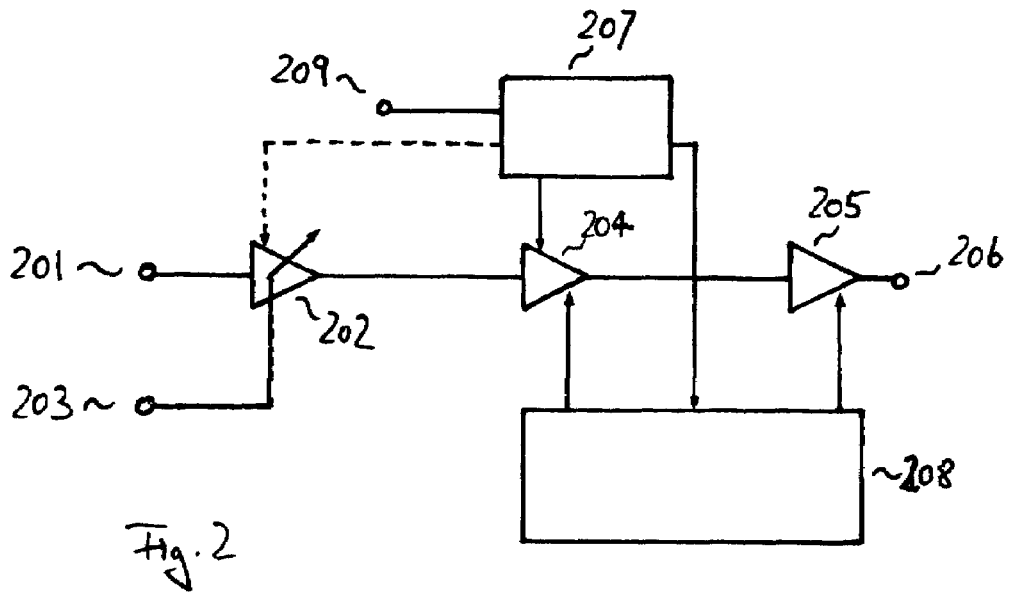
FIG. 2 illustrates an embodiment of an amplification apparatus.

FIG. 2 illustrates an embodiment of an amplification apparatus.

The amplification apparatus includes a signal input 201 for receiving a radio frequency signal to be transmitted. The radio frequency signal is fed by a signal input 201 into a variable gain amplifier stage 202. The amplification apparatus includes a second input 203 connected to the variable gain amplifier 202. The second input 203 is receiving a gain setting signal fed into the variable gain amplifier stage 202 so as to set a gain of the variable gain amplifier stage 202. An output of the variable gain amplifier stage 202 is connected to an input of a pre-amplifier stage 204. An output of the pre-amplifier stage 204 is connected to an input of an output stage 205. An output of the output stage 105 is connected to a signal output 206. The series of the variable gain amplifier stage 202, the pre-amplifier stage 204, and the output stage 205 forms a transmission chain to boost the power of the radio frequency signal received at the signal input 201 to a power level of an outgoing transmission signal disposed at the signal output 206. In various embodiments, the transmission chain may include solely a pre-amplifier stage and an output stage. Other embodiments may include one or more additional amplifier stages to boost the signal.

The amplification apparatus includes a supply voltage circuitry 207 that is coupled to the pre-amplifier stage 204 to provide a supply voltage thereto. The supply voltage variable and is regulated by the supply voltage circuitry 207.

In some embodiments the supply voltage circuitry 207 is disconnected from the output stage 205 and the output stage 205 receives a constant supply voltage. This is particularly advantageous if most of the power of the transmission chain is realized in the output stage 205. The supply voltage circuitry can be regarded as a regulator regulating the output power level. A part of the power input in the amplification apparatus is dissipated in the supply voltage circuitry 207. If the regulation of the output power level is performed in the pre-amplifier stage 204 and not in the output stage 205 the efficiency of the amplification apparatus is higher than compared to an embodiment using supply voltage circuitry 207 to regulate the supply voltage of the output stage 205.

Yet, in various other embodiments the supply voltage circuitry feeds a first supply voltage to the pre-amplifier stage 204 and a second supply voltage to the output stage 205, and the first supply voltage and the second supply voltage differ in value. This is particularly advantageous if the output stage 205 is inserting a larger part of the power level into the transmission chain and regulating the output power level is also performed in the output stage, e.g. so to achieve a larger dynamic range. In other embodiments the first supply voltage and the second supply voltage are identical in value.

The supply voltage circuitry 207 is connected to a bias voltage circuitry 208 that is included in the amplification apparatus. The bias voltage circuitry 208 is coupled to the pre-amplifier stage 204 and to the output stage 205. It feeds a respective bias voltage thereto. In various embodiments this bias voltage sets an operation point of the pre-amplifier stage 204 and/or the output stage 205. The bias voltage circuitry 208 is coupled to the supply voltage circuitry 207 and receives a supply voltage signal or a signal derived from or being in a relation to the supply voltage signal by the supply voltage circuitry 207. In accordance with that supply voltage signal the bias voltage circuitry 208 produces the bias voltage fed to the output stage 205. In various embodiments the bias voltage fed into the pre-amplifier stage 204 remains unchanged. By this provision the transmission chain is linear. This is particularly advantageous in a transmission system using an amplitude modulation such as GSM-EDGE or UMTS. In other embodiments the bias voltage fed into the pre-amplifier stage 204 is changed as a function of the supply voltage. This might be performed in a transmission system like GSM-GMSK, WDCT or DECT where no linearity is required in the transmission chain.

The amplification apparatus further includes a supply voltage control input 209 connected to the supply voltage circuitry 207. In various embodiments a supply voltage control signal is fed into the supply voltage control input 209. In some embodiments the supply voltage control signal is provided by a baseband unit that includes a microcontroller, a DSP or any other suitable processing element. In some embodiments the supply voltage control signal is provided by a transformer and/or by a ramping control unit as shown e.g. in the transmitter of FIG. 1. The supply voltage control signal may be used to control a ramping up and/or ramping down process of the amplification apparatus. In various embodiments the supply voltage control signal may also be used to imprint an amplitude modulation onto the signal processed by the amplification apparatus. The supply voltage control signal may correspond to the amplitude information signal shown in FIG. 1. In some embodiments the supply voltage control signal may be used to regulate the power level of the outgoing signal during a transmission interval.

In various embodiments the gain setting signal fed into the variable gain amplifier stage 202 is used to imprint an amplitude modulation onto the signal processed by the amplification apparatus. In different embodiments the gain setting signal is used to regulate the power level of the outgoing signal during a transmission interval. In various embodiments the gain setting signal corresponds to the amplitude information signal shown in FIG. 1.

Figure 3:
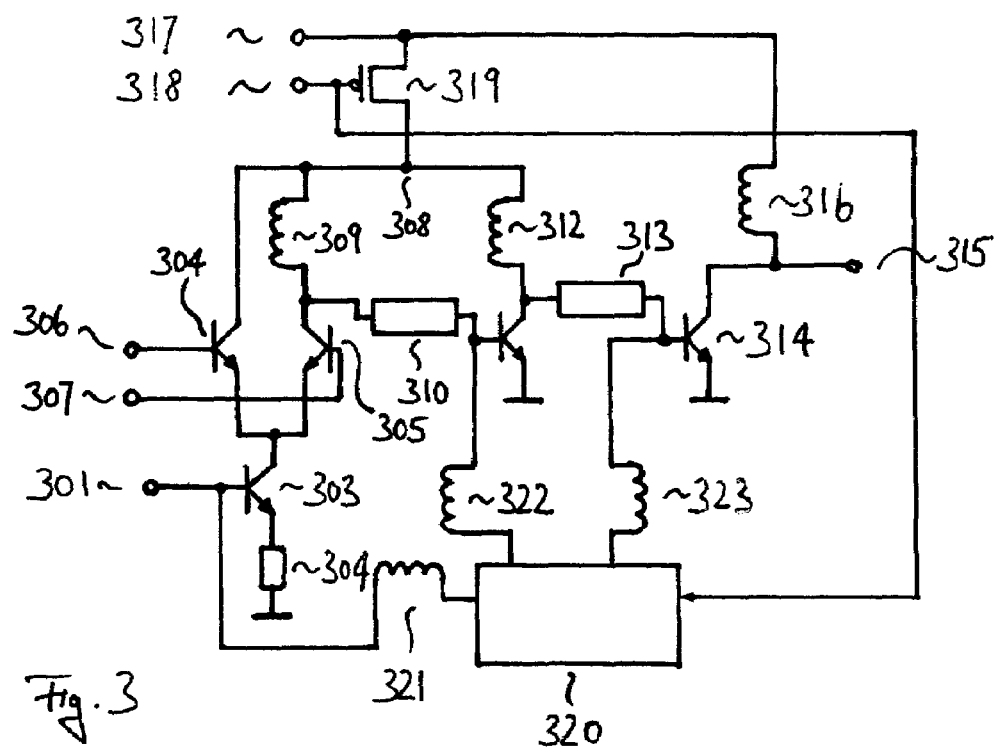
FIG. 3 illustrates an embodiment of an amplification apparatus.

FIG. 3 is a circuitry representation illustrating one embodiment of an amplification apparatus.

The amplification apparatus includes a signal input 301 connected to a first voltage node. The first voltage node is connected to a base of a first npn-transistor 303. An emitter of the first npn-transistor 303 is coupled via a first resistor 302 to ground. A collector of the first npn-transistor 303 is connected to each of respective emitters of a differential pair of a second npn-transistor 304 and a third npn-transistor 305. A base of the second npn-transistor 304 is connected to a first gain setting voltage input 306 and a base of the third npn-transistor 305 is connected to second gain setting voltage input 307. A collector of the second npn-transistor 304 is connected to a local supply voltage node 308. A collector of the third npn-transistor 305 is connected via a first inductor 309 to the local supply voltage node 308. The first npn-transistor 303 and the differential pair of the second npn-transistor 304 and the third npn-transistor 305 thus form differential amplifier with variable gain. The gain is set by a gain setting voltage disposed at the first gain setting voltage input 306 and the second gain setting voltage input 307. A radio frequency signal to be amplified is received at the signal input 301. A first amplified signal being the radio frequency signal amplified by a gain determined by the gain setting voltage is disposed at the collector of the third npn-transistor 305.

The collector of the third npn-transistor 305 is connected via a first matching network 310 to a base of a fourth npn-transistor 311. An emitter of the fourth npn-transistor 311 is connected to ground. A collector of the fourth npn-transistor 311 is coupled via a second inductor 312 to the local supply voltage node 308. At the collector of the fourth npn-transistor 311 a second amplified signal derived from the first amplified signal is disposed. The fourth npn-transistor 311 being a grounded emitter amplifier represents a pre-amplifier stage, which amplifies the first amplified signal to produce the second amplified signal. The gain of the pre-amplifier is set by regulating the voltage disposed at the local supply voltage node 308.

The first matching network 310 may by a low pass filtering element comprising a series inductor and a shunt capacitor. In another embodiment the first matching network 310 is a high pass filtering element comprising a series capacitor and a shunt inductor.

The collector of the fourth npn-transistor 311 is connected via a second matching network 313 to a base of a fifth npn-transistor 314. An emitter of the fifth npn-transistor 314 is connected to ground. A collector of the fifth npn-transistor 314 is connected to a signal output 315. The fifth npn-transistor 314 being a grounded emitter amplifier represents an output stage, which amplifies the second amplified signal to produce an output signal. The collector of the fifth npn-transistor 314 is furthermore connected via a third inductor 316 to a supply voltage input 317. A global supply voltage disposed at the supply voltage input 317 sets the gain of the fifth npn-transistor 314, i.e. the output stage.

The second matching network 313 may be a low pass filtering element comprising a series inductor and a shunt capacitor. In an embodiment, the second matching network 313 is a high pass filtering element comprising a series capacitor and a shunt inductor.

The amplification apparatus includes a supply voltage control input 318 connected to a gate of a PMOS-transistor 319.

A drain of the PMOS-transistor 319 is connected to the supply voltage input 317. A source of the PMOS-transistor 319 is connected to the local supply voltage node 308. The PMOS-transistor 319 thus represents a linear regulator regulating the voltage disposed at the local supply voltage node 308; said voltage being derived from the supply voltage in dependence of a supply voltage control signal received at the supply voltage control input 318. The voltage disposed at the local supply voltage node 308 represents a supply voltage to the variable gain amplifier stage and the pre-amplifier stage. The PMOS-transistor 319 and the circuitry, which connects it to the supply voltage input 317, the supply voltage control input 318, and to the local supply voltage node 308 correspond to a supply voltage circuitry.

The amplification apparatus includes a bias voltage circuitry 320, which is connected to the supply voltage control input 318. In some embodiments the bias voltage circuitry 320 is connected via the local supply voltage node 308 to the supply voltage control input 318. The bias voltage circuitry 320 is connected via a fourth inductor 321 and via the first voltage node to the base of the first npn-transistor 303; the bias voltage circuitry 320 is connected via a fifth inductor 322 to the base of the fourth npn-transistor 311; and the bias voltage circuitry 320 is connected via a sixth inductor 323 to the base of the fifth npn-transistor 311.

As shown in FIG. 3, the embodiment is implemented in a bipolar semiconductor technology, while the regulator is realized as the PMOS-transistor 319. In other embodiments the amplification apparatus is realized in a CMOS (Complementary Metal-Oxide Semiconductor) technology. Other semiconductor technology may be suitable as well. In some embodiments the PMOS-transistor 319 may be replaced by a bipolar transistor, by an NMOS-transistor or a regulation circuitry. In various embodiments the PMOS-transistor 319 is replaced by a switched regulator. As shown in FIG. 3, the amplitude information may be imprinted on the outgoing signal by means of the gain setting voltage or by means of a supply voltage control signal received by the supply voltage control input 318. The two of the gain setting voltage or the supply voltage control signal may also be used together or separately for a ramping process or an adjustment of the power level of the outgoing signal while transmission.

Figure 4:
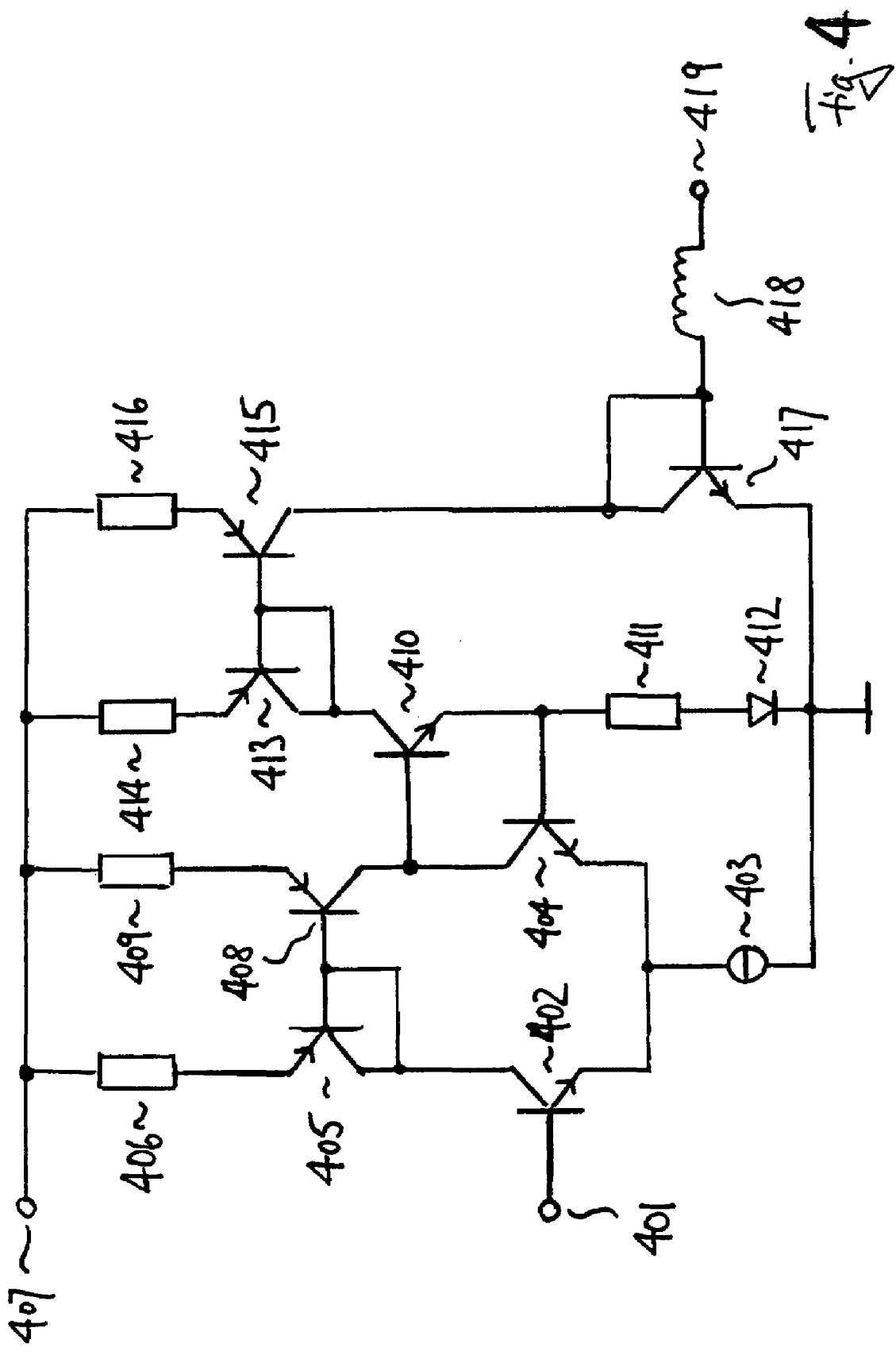
FIG. 4 illustrates an embodiment of a bias voltage circuitry.

FIG. 4 illustrates an embodiment of a bias voltage circuitry.

The bias voltage circuitry includes a reference voltage input 401 coupled to a base of a sixth npn-transistor 402. An emitter of the sixth npn-transistor 402 is connected to a constant current source 403. The emitter of the sixth npn-transistor 402 is also connected to an emitter of a seventh npn-transistor 404. A collector of the sixth transistor 402 is connected to a collector and the base of a first pnp-transistor 405. The base and the collector of the first pnp-transistor 405 are directly coupled so that the first pnp-transistor 405 is diode-connected. An emitter of the first pnp-transistor 405 is connected via a second resistor 406 to a second constant supply voltage input 407. The base of the first pnp-transistor 405 is connected to a base of a second pnp-transistor 408. An emitter of the second pnp-transistor 408 is connected via a third resistor 409 to the second constant supply voltage input 407. A collector of the second pnp-transistor 408 is connected to a collector of the seventh npn-transistor 404.

The sixth npn-transistor 402 and the seventh npn-transistor 404 form a differential pair, while the first pnp-transistor 405 and the second pnp-transistor 408 are current-mirror-coupled. All these elements are connected as a differential amplifier with an active load. The current mirror formed by the first pnp-transistor 405 and the second pnp-transistor 408 may be considered as active load.

The collector of the seventh npn-transistor 404 and the collector of the second pnp-transistor 408 are both connected to the base of an eighth npn-transistor 410. An emitter of the eighth npn-transistor 410 and a base of the seventh npn-transistor 404 are both connected via a fourth resistor 411 and a diode 412 coupled in series to ground.

One could describe the circuitry of FIG. 4 illustrated so far as a voltage controlled current source employing a series-series feedback through a resistance defined by said series of the fourth resistor 411 and the diode 412. The current-source would be the eighth npn-transistor 410 controlled by voltage produced by shown differential amplifier with active load.

A collector of the eighth npn-transistor 410 is connected to a collector and a base of a third pnp-transistor 413. An emitter of the third pnp-transistor 413 is connected via a fifth resistor 414 to the constant supply voltage input 407. The base and the collector of the third pnp-transistor 413 are directly connected so that the third pnp-transistor 413 is diode-connected. The base of the third pnp-transistor 413 is connected to a base of a fourth pnp-transistor 415. The emitter of the fourth pnp-transistor 415 is connected via a sixth resistor 416 to the constant supply voltage input 407. Thus the third pnp-transistor 413 and the fourth pnp-transistor 415 form a current mirror.

A collector of the fourth pnp-transistor 415 is connected to a collector and a base of a ninth npn-transistor 417. An emitter of the ninth npn-transistor 417 is grounded. The collector and the base of the ninth npn-transistor 417 are directly coupled so that the ninth npn-transistor is diode-connected. The collector and the base of the ninth npn-transistor 417 are connected via a seventh inductor 418 to a bias voltage output 419.

The bias voltage circuitry of FIG. 4 calculates a bias voltage provided at the bias voltage output 419 from a reference voltage fed into the reference voltage input 401. The relation of the bias voltage with respect to the reference voltage is taking into account a temperature dependence of the diode 412. In various embodiments the diode 412 is replaced by a diode coupled to the reference voltage input 401 to get a relation between bias voltage and reference voltage that is temperature dependent. In some embodiments the diode 412, i.e. an explicit temperature dependence, is completely omitted.

The reference voltage could be the supply voltage fed into a first amplifier such as the pre-amplifier stage shown in FIG. 2 or FIG. 3. It could be any derivative thereof or it could correspond to a supply voltage control signal fed into a supply voltage circuitry.

The bias voltage provided at the bias voltage output 419 could be fed directly or indirectly via a resistor or an inductor into a second amplifier such as the output stage shown in FIG. 2 or FIG. 3. It could as well be fed either directly or indirectly in another amplifier, such as the first amplifier.

As in FIG. 3 the embodiment of FIG. 4 is shown in a bipolar technology. It could be likewise realized an other semiconductor technology such as CMOS.

What is claimed is:

1. Amplification apparatus comprising:
    an amplifier;
    a bias voltage circuitry coupled to the amplifier to provide a bias voltage thereto;
    a supply voltage circuitry coupled to the amplifier to provide a supply voltage thereto;
    wherein the supply voltage circuitry is coupled to the bias voltage circuitry; and
    wherein the bias voltage circuitry is configured to provide the bias voltage depending on the supply voltage;

the amplifier comprising a first amplifier stage coupled in series with a second amplifier stage;
the bias voltage circuitry coupled to the second amplifier to provide the bias voltage thereto;
the supply voltage circuitry coupled to the first amplifier to provide the supply voltage thereto.

2. Amplification apparatus according to claim 1, the amplifier comprising a third amplifier coupled in series with the first amplifier and the second amplifier.

3. Amplification apparatus according to claim 2, wherein the third amplifier is a variable gain amplifier.

4. Amplification apparatus according to claim 1, wherein the bias voltage circuitry is coupled to the first amplifier to provide a second bias voltage thereto.

5. Amplification apparatus comprising:
an amplifier;
a bias voltage circuit coupled to the amplifier to provide a bias voltage thereto;
a supply voltage circuitry coupled to the amplifier to provide a supply voltage thereto;
wherein the supply voltage circuitry is coupled to the bias voltage circuitry;
wherein the bias voltage circuitry is configured to provide the bias voltage depending on the supply voltage; and
a supply voltage control signal input coupled to supply voltage circuitry to feed a supply voltage control signal to the supply voltage circuitry.

6. Amplification apparatus according to claim 5, wherein the supply voltage is derived from a global supply voltage in dependence of the supply voltage control signal.

7. Amplification apparatus comprising:
an amplifier;
a bias voltage circuitry coupled to the amplifier to provide a bias voltage thereto;
a supply voltage circuitry coupled to the amplifier to provide a supply voltage thereto;
wherein the supply voltage circuitry is coupled to the bias voltage circuitry;
wherein the bias voltage circuitry is configured to provide the bias voltage depending on the supply voltage; and
wherein the supply voltage circuitry comprises a linear regulator to provide a supply voltage derived from a constant supply voltage.

8. Amplification apparatus comprising:
an amplifier;
a bias voltage circuitry coupled to the amplifier to provide a bias voltage thereto;
a supply voltage circuitry coupled to the amplifier to provide a supply voltage thereto;
wherein the supply voltage circuitry is coupled to the bias voltage circuitry;
wherein the bias voltage circuitry is configured to provide the bias voltage depending on the supply voltage; and
wherein the bias voltage circuitry comprises a voltage controlled current source.

9. Amplification apparatus according to claim 8, wherein the voltage controlled current source receives the supply voltage or a derivative thereof.

10. Amplification apparatus according to claim 8, wherein the voltage controlled current source receives the supply voltage control signal.

11. Amplification apparatus according to claim 8, wherein the voltage controlled current source comprises a feedback through a resistance.

12. Amplification apparatus according to claim 11, wherein the resistance comprises a temperature depending element.

13. Amplification apparatus according to claim 11, wherein the temperature depending element is a diode.

14. Transmission apparatus comprising:
a pre-amplifier stage, that receives an input signal and provides an output signal;
a power regulator connected to the pre-amplifier stage, that provides a power control signal to the pre-amplifier stage to regulate an output power of the output signal;
an output stage, that receives the output signal and provides a transmission signal;
a controller connected to the output stage, that provides an operation control signal to the output stage to control an operating point thereof;
wherein the controller is connected to the power regulator to receive the power control signal;
wherein the controller calculates the operation control signal as function of the power control signal;
a voltage gain amplifier that receives a radio frequency signal and provides the input signal;
wherein the voltage gain amplifier comprises a gain setting input to receive a gain setting signal; and
wherein the gain setting signal represents a ramping information of the transmission signal.

15. Transmission apparatus comprising:
a preamplifier stage, that receives an input signal and provides an output signal;
a power regulator connected to the preamplifier stage, that provides a power control signal to the preamplifier stage to regulate an output power of the output signal;
an output stage, that receives the output signal and provides a transmission signal;
a controller connected to the output stage, that provides an operation control signal to the output stage to control an operating point thereof;
wherein the controller is connected to the power regulator to receive the power control signal;
wherein the controller calculates the operation control signal as function of the power control signal; and
wherein the power regulator comprises a linear regulator receiving a second gain setting signal.

16. Transmission apparatus according to claim 15 wherein the second gains setting signal represents an amplitude information of the transmission signal.

17. Transmission apparatus according to claim 15 wherein the second gains setting signal represents a ramping information of the transmission signal.

18. Method for power adjustment of an amplifier having serial connection of a pre-amplifier stage and an output stage comprising:
providing a power signal;
setting a gain of the pre-amplifier stage in accordance to the power signal;
calculating an operation control signal in dependence of the power signal;
setting an operation point of the output stage in dependence to the operation control signal; and
setting a second operation point of the pre-amplifier stage in dependence to the operation control signal.

* * * * *